(12) United States Patent
Sjölén et al.

(10) Patent No.: US 9,028,960 B2
(45) Date of Patent: May 12, 2015

(54) PVD COATING FOR METAL MACHINING

(75) Inventors: Jacob Sjölén, Fagersta (SE); Jon Andersson, Vasteras (SE); Jörg Vetter, Bergisch Gladbach (DE); Jürgen Müller, Olpe (DE)

(73) Assignee: Seco Tools AB, Fagersta (SE)

( * ) Notice: Subject to any disclaimer, the term of this patent is extended or adjusted under 35 U.S.C. 154(b) by 192 days.

(21) Appl. No.: 13/636,749

(22) PCT Filed: Apr. 21, 2011

(86) PCT No.: PCT/EP2011/056430
§ 371 (c)(1),
(2), (4) Date: Nov. 15, 2012

(87) PCT Pub. No.: WO2011/131756
PCT Pub. Date: Oct. 27, 2011

(65) Prior Publication Data
US 2013/0071617 A1    Mar. 21, 2013

(30) Foreign Application Priority Data

Apr. 23, 2010 (EP) ...................................... 10160874

(51) Int. Cl.
| | |
|---|---|
| *C23C 14/06* | (2006.01) |
| *C09D 1/00* | (2006.01) |
| *C23C 14/54* | (2006.01) |
| *C23C 28/04* | (2006.01) |
| *C23C 28/00* | (2006.01) |
| *C23C 30/00* | (2006.01) |

(52) U.S. Cl.
CPC .............. *C09D 1/00* (2013.01); *C23C 14/0641* (2013.01); *C23C 14/54* (2013.01); *C23C 28/044* (2013.01); *C23C 28/44* (2013.01); *C23C 30/005* (2013.01)

(58) Field of Classification Search
CPC ...... C09D 1/00; C23C 14/0641; C23C 14/54; C23C 28/044; C23C 28/44; C23C 30/005
See application file for complete search history.

(56) References Cited

U.S. PATENT DOCUMENTS

| | | | | |
|---|---|---|---|---|
| 5,071,693 | A * | 12/1991 | Sue et al. ...................... | 428/212 |
| 6,562,445 | B2 * | 5/2003 | Iwamura ...................... | 428/217 |
| 7,258,912 | B2 * | 8/2007 | Yamamoto et al. ........... | 428/216 |
| 7,537,822 | B2 * | 5/2009 | Ishikawa ....................... | 428/699 |
| 7,727,621 | B2 * | 6/2010 | Nordlof et al. ............... | 428/697 |
| 7,947,363 | B2 * | 5/2011 | Xu et al. ....................... | 428/698 |

(Continued)

FOREIGN PATENT DOCUMENTS

| | | |
|---|---|---|
| CN | 101596610 A | 12/2009 |
| EP | 0 418 001 | 3/1991 |

(Continued)

OTHER PUBLICATIONS

International Search Report dated Sep. 23, 2011, corresponding to PCT/EP2011/056430.

*Primary Examiner* — Archene Turner
(74) *Attorney, Agent, or Firm* — Young & Thompson

(57) ABSTRACT

A wear resistant coating suitable to be deposited on cutting tool inserts for chip forming metal machining, includes at least two layers with different grain size, but with essentially the same composition. The coating is deposited by Physical Vapor Deposition (PVD).

14 Claims, 1 Drawing Sheet

(56) References Cited

U.S. PATENT DOCUMENTS

| | | | |
|---|---|---|---|
| 8,283,058 B2 * | 10/2012 | Martensson et al. | 428/697 |
| 8,691,374 B2 * | 4/2014 | Ni et al. | 428/698 |
| 2001/0031346 A1 | 10/2001 | Iwamura | |
| 2005/0170162 A1 | 8/2005 | Yamamoto et al. | |
| 2008/0299366 A1 | 12/2008 | Ahlgren et al. | |
| 2008/0299383 A1 | 12/2008 | Martensson et al. | |
| 2011/0139958 A1 * | 6/2011 | Vaidyanathan | 249/114.1 |

FOREIGN PATENT DOCUMENTS

| | | | |
|---|---|---|---|
| JP | 09-300105 | * | 11/1997 |
| JP | 2003-340608 | * | 12/2003 |
| JP | 2004-106108 | * | 4/2004 |
| WO | 2010024902 | | 3/2010 |

* cited by examiner

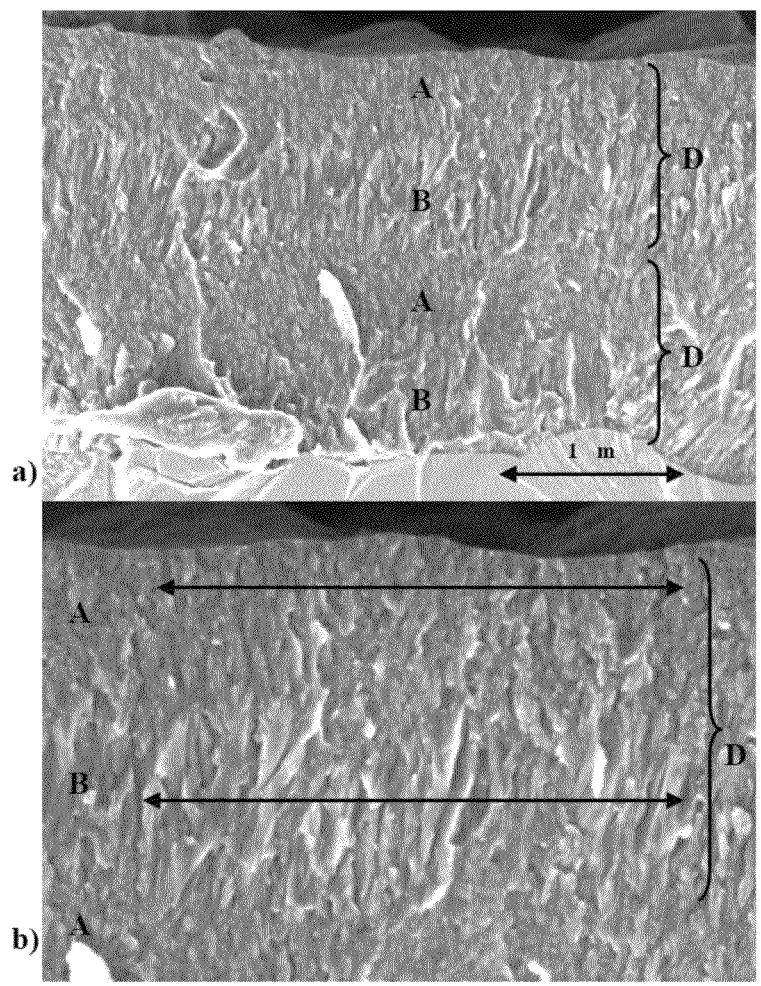

PVD COATING FOR METAL MACHINING

BACKGROUND OF THE INVENTION

1. Field of the Invention

The present invention relates to a wear resistant coating suitable to be deposited on cutting tool inserts for chip forming metal machining. The coating comprises at least two layers with different grain size, but with essentially the same composition. The coating is deposited by Physical Vapour Deposition (PVD).

2. Description of the Related Art

The increased productivity in modern chip forming metal machining requires tools with high reliability and excellent wear properties. It has been known since the end of the 1960s that tool life can be significantly improved by applying a suitable coating to the surface of the tool. Chemical Vapour Deposition (CVD) was the first deposition technique used for cutting tools and this method is still commonly used for deposition of TiN, Ti(C,N), and $Al_2O_3$ layers. Physical Vapour Deposition (PVD) was introduced in the 1980s and has since then been developed from deposition of stable metallic compounds like TiN or Ti(C,N) to include deposition of multicomponent, metastable compounds like (Ti,Al)N, (Ti,Si)N, or (Al,Cr)N, by such methods as sputtering or cathodic arc evaporation. The properties of these coatings are optimised for specific applications, and thus the performance of the coatings is significantly reduced outside their respective application areas. As an example, fine grained coatings with typical grain sizes of about 5-30 nm find a typical use in end milling with very small chip thicknesses, while coarse grained coatings with typical grain sizes of about 50-500 nm are generally superior as chip thickness and temperature increase in milling and turning applications using indexable inserts.

SUMMARY OF THE INVENTION

It is an object of the present invention to provide a coating with high machining performance in a broad area of applications ranging from very small to large chip thicknesses.

The present invention relates to a wear resistant coating suitable to be deposited on cutting tool inserts for chip forming metal machining. The coating according to the invention comprises at least two layers with essentially the same composition, but with different grain sizes. The coating has a wide application area ranging from fine machining using end mills to medium or rough machining with indexable inserts. The coating is deposited by Physical Vapour Deposition.

BRIEF DESCRIPTION OF THE DRAWINGS

FIG. 1 shows fracture cross section scanning electron microscopy (SEM) images of a coating according to the invention. The coating contains two double layers (marked D in the FIGURE), each containing one fine grained layer (marked A) and one coarse grained layer (marked B).

DETAILED DESCRIPTION

The present invention relates to a wear resistant PVD coating for chip forming metal machining cutting tools. The coating comprises one or more D double layers, where each D double layer consists of one inner B layer and one outer A layer, the A layer being deposited onto the B layer without intermediate layers. Layers A and B have essentially the same chemical composition but differ from each other with respect to their average grain widths, $w_A$ and $w_B$, so that $w_A < w_B$. The grain width, w, of a layer is evaluated on a fracture cross section scanning electron microscopy (SEM) image over at least 20 grains along a line perpendicular to the growth direction in the centre of the layer. With essentially the same chemical composition it is herein meant that the A and B layers are deposited from identical cathodes and that, due to differences in process conditions for A and B layer deposition, the resulting A and B layers contain the same chemical elements but the atomic content of each element, excluding nitrogen, may vary within approximately ±3 at. % units, while the nitrogen content is constant within each D double layer.

Within each D double layer, preferably the A layer is fine grained with $2 < w_A < 50$ nm, the B layer has coarse and essentially columnar grains with $30 < w_B < 500$ nm, and $w_B/w_A > 2$. The thickness of the A layer is between 0.03 and 5 µm, preferably between 0.05 and 2 µm, and the thickness of the B layer is between 0.1 and 5 µm, preferably between 0.2 and 2 µm. The number of D double layers is between 1 and 100, preferably between 1 and 20, most preferably between 1 and 10. The total thickness of all D double layers is between 0.3 and 20 µm, preferably between 0.5 and 10 µm. The transitions between A and B layers or between D double layers are preferably either abrupt or gradual, but the coating can also comprise one or more intermediate layers between D double layers to a thickness of between 0.5 and 20 µm.

The present invention also relates to a coating comprising one or more D double layers with a continuous decrease from coarse to fine grain size within at least one of the D double layers. The D double layer is then divided into two layer portions of fine and coarse grain size, and these layer portions are defined as layers A and B, respectively.

The coating according to the invention may further comprise an inner single- and/or multilayer, as known in the art, located between the substrate and the innermost D double layer, and/or an outer single- and/or multilayer, located onto the outermost D double layer, to a total coating thickness of between 0.5 and 30 µm, preferably between 0.5 and 15 µm and most preferably between 0.5 and 10 µm.

In one preferred embodiment the coating comprises one D double layer.

In another preferred embodiment the coating comprises two D double layers.

In a third preferred embodiment the A and B layers have compositions according to the chemical formula $(Ti_{1-x1-y1}Al_{x1}Me_{y1})(N_{1-a1}Q_{a1})_{z1}$, where $0.3 < x1 < 0.7$, $0 \leq y1 < 0.3$, preferably $0 \leq y1 < 0.15$, most preferably $y1=0$, $0.90 < z1 < 1.10$, preferably $0.96 < z1 < 1.04$, $0 \leq a1 < 0.5$, preferably $0 \leq a1 < 0.3$, most preferably $a1=0$. Me is one or more of Zr, Hf, V, Nb, Ta, Cr, Y, Sc, Ce, Mo, W, and Si, preferably one or more of Zr, Hf, V, Nb, Cr, Ce, and Si, and Q is one or more of C, B, S, and O.

In fourth preferred embodiment the A and B layers have compositions according to the chemical formula $(Ti_{1-x2-y2}Si_{x2}Me_{y2})(N_{1-a2}Q_{a2})_{z2}$, where $0.02 < x2 < 0.25$, $0 \leq y2 < 0.3$, preferably $0 \leq y2 < 0.15$, most preferably $y2=0$, $0.90 < z2 < 1.10$, preferably $0.96 < z2 < 1.04$, $0 \leq a2 < 0.5$, preferably $0 \leq a2 < 0.3$, most preferably $a2=0$. Me is one or more of Zr, Hf, V, Nb, Ta, Cr, Y, Sc, Ce, Mo, W, and Al, preferably one or more of Zr, Hf, V, Nb, Cr, Ce, and Al, and Q is one or more of C, B, S, and O.

In a fifth preferred embodiment the A and B layers have compositions according to the chemical formula $(Cr_{1-x3-y3}Al_{x3}Me_{y3})(N_{1-a3}Q_{a3})_{z3}$, where $0.3 < x3 < 0.75$, $0 \leq y3 < 0.3$, preferably $0 \leq y3 < 0.15$, most preferably $y3=0$, $0.90 < z3 < 1.10$, preferably $0.96 < z3 < 1.04$, $0 \leq a3 < 0.5$, preferably $0 \leq a3 < 0.3$, most preferably $a3=0$. Me is one or more of Zr, Hf, V, Nb, Ta, Cr, Y, Sc, Ce, Mo, W, and Ti, preferably one or more of Zr, Hf, V, Nb, Cr, Ce, and Ti, and Q is one or more of C, B, S, and O.

The A and B layers according to the invention are deposited by PVD, preferably by cathodic arc evaporation. The variation in grain size can be achieved by several means, for example by 1) changing the magnetic field at the cathode, 2) changing the deposition temperature, and/or 3) changing the evaporation current. It is within the purview of the skilled artisan to determine by experiments the appropriate process conditions.

Example 1

A (Ti,Al)N coating according to the invention was deposited by cathodic arc evaporation onto cemented carbide inserts with main composition 90 wt % WC+10 wt % Co.

Before deposition, the inserts were cleaned in ultrasonic baths of an alkali solution and alcohol. The deposition chamber was evacuated to a base pressure of less than $2.0 \times 10^{-3}$ Pa, after which the inserts were sputter cleaned with Ar ions. The coating was deposited from TiAl composite cathodes with composition Ti:Al=34:66 in 99.995% pure $N_2$ atmosphere at a total pressure of 4 Pa, using a bias voltage of −80 V and an evaporation current of 90 A at 450° C. The magnetic field in front of the cathode surface was adjusted between two levels, $M_{strong}$ and $M_{weak}$, to yield A and B layers, respectively, $M_{strong}$ is mainly perpendicular to the cathode surface and has a field strength varying over the cathode surface in the range 3-20 mT, and $M_{weak}$ varying over t is also mainly perpendicular to the cathode surface with a field strength in the range 0.5-2.5 mT. First, a B layer was deposited at $M_{weak}$ for 20% of the total deposition time, then an A layer at $M_{strong}$ for 30%, and then the same sequence was repeated once.

The coating was studied with scanning electron microscopy (SEM). FIG. 1 shows SEM images of a fracture cross section where the two D double layers, each consisting of one A and one B layer, are clearly seen. The average grain width, w, was evaluated along lines as indicated in FIG. 1b. Both A layers had fine, equiaxed grains with w~19 nm and both B layers had coarser, columnar grains with w~61 nm. The total layer thickness was about 2 μm.

Example 2

A (Ti,Al)N coating according to the invention was deposited by cathodic arc evaporation onto cemented carbide inserts with main composition 90 wt % WC+10 wt % Co. The deposition conditions were the same as for example 1, but first a B layer was deposited at $M_{weak}$ for 70% of the deposition time and then an A layer at $M_{strong}$ for 30%. The average grain widths, w, were evaluated to w~70 nm for layer B and w~18 nm for layer A. The total thickness was about 2 μm.

Example 3

The coatings from examples 1 (here labelled Inv1) and 2 (Inv2) were tested in a milling operation with the following data:
Geometry: XOEX120408R-M07
Application: Square shoulder milling
Work piece material: AISI 316L
Cutting speed: 160 m/min
Feed: 0.15 mm/tooth
Depth of cut: 2 mm
Width of cut: 13 mm (26%)
Tool life criteria: Flank wear (vb)>0.3 mm As references, two commercially available (Ti,Al)N coatings of similar composition and thickness as the inventive coating was used, Ref1 and Ref2. Ref1 is current state-of-the-art for this specific milling application and has columnar and coarse grains with w~100 nm Ref2 is fine grained with w~15 nm

| Coating | Tool life |
|---|---|
| Inv1 | 15 min |
| Inv2 | 17 min |
| Ref1 | 15 min |
| Ref2 | 5 min |

The table shows that the attained tool lives for the inventive coatings were found to be on the same level or even higher than that of Ref1 and significantly higher than that of Ref2.

Example 4

The coatings from examples 1 (here labelled Inv1) and 2 (Inv2) were tested in fine machining with coated end mills using the following data:
Geometry: 10 mm square shoulder cemented carbide end mill
Application: Square shoulder milling
Work piece material: Ck45W
Cutting speed: 120 m/min (3800 rpm)
Feed: 0.05 mm/tooth (380 mm/min)
Depth of cut: 13 mm
Width of cut: 5 mm
Tool life criteria: Cutting edge condition (swarf deterioration)

As references, the same commercially available (Ti,Al)N coatings as in example 3 were used, Ref1 and Ref2. Ref2 is current state-of-the-art for this specific application.

| Coating | Cutting length |
|---|---|
| Inv1 | 60 m |
| Inv2 | 70 m |
| Ref1 | 10 m |
| Ref2 | 60 m |

The table shows that the attained tool lives for the inventive coatings were found to be similar to or higher than that of Ref2 and significantly higher than that of Ref1.

The invention claimed is:
1. A wear resistant PVD coating for chip forming metal machining cutting tools, comprising:
one or more D double layers, where each D double layer consists of one B layer and one A layer, the A layer being deposited onto the B layer without intermediate layers, and where A and B have essentially the same chemical composition but differ from each other with respect to their average grain widths, $w_A$ and $w_B$, so that $w_A<w_B$ and $w_B/w_A>2$,
wherein within each D double layer, the A layer is fine grained with $2<w_A<50$ nm, the B layer is coarse grained with $30<w_B<500$ nm, and
a thickness of each A layer is between 0.03 and 5 μm and a thickness of each B layer is between 0.1 and 5 μm, whereby the total thickness of all D double layers is between 0.3 and 20 μm.
2. The coating according to claim 1, wherein said coating comprises one or more intermediate layers between D double layers to a thickness of between 0.5 and 20 μm.

3. The coating according to claim 2, wherein said coating comprises an inner single- and/or multilayer, located between the substrate and the innermost D double layer, and/or an outer single- and/or multilayer, located onto the outermost D double layer, to a total coating thickness of between 0.5 and 30 μm.

4. The coating according to claim 2, wherein said A and B layers have compositions according to the chemical formula $(Ti_{1-x1-y1}Al_{x1}Me_{y1})(N_{1-a1}Q_{a1})_{z1}$, where $0.3<x1<0.7$, $0\leq y1<0.3$, $0.90<z1<1.10$, $0\leq a1<0.5$, Me is one or more of Zr, Hf, V, Nb, Ta, Cr, Y, Sc, Ce, Mo, W, and Si, and Q is one or more of C, B, S, and O.

5. The coating according to claim 2, wherein said A and B layers have compositions according to the chemical formula $(Ti_{1-x2-y2}Si_{x2}Me_{y2})(N_{1-a2}Q_{a2})_{z2}$, where $0.02<x2<0.25$, $0<y2<0.3$, $0.90<z2<1.10$, $0\leq a2<0.5$, Me is one or more of Zr, Hf, V, Nb, Ta, Cr, Y, Sc, Ce, Mo, W, and Al, and Q is one or more of C, B, S, and O.

6. The coating according to claim 2, wherein said A and B layers have compositions according to the chemical formula $(Cr_{1-x3-y3}Al_{x3}Me_{y3})(N_{1-a3}Q_{a3})_{z3}$, where $0.3<x3<0.75$, $0\leq y3<0.3$, $0.90<z3<1.10$, $0\leq a3<0.5$, Me is one or more of Zr, Hf, V, Nb, Ta, Cr, Y, Sc, Ce, Mo, W, and Ti, and Q is one or more of C, B, S, and O.

7. The coating according to claim 1, wherein said coating comprises a single- and/or multilayer, located between a substrate and a first D double layer, and/or an single- and/or multilayer, located onto a second D double layer located on the first D double layer, to a total coating thickness of between 0.5 and 30 μm.

8. The coating according to claim 1, wherein said A and B layers have compositions according to the chemical formula $(Ti_{1-x-y1}Al_{x1}Me_{y1})(N_{1-a1}Q_{a1})_{z1}$, where $0.3<x1<0.7$, $0<y1<0.3$, $0.90<z1<1.10$, $0\leq a1<0.5$, Me is one or more of Zr, Hf, V, Nb, Ta, Cr, Y, Sc, Ce, Mo, W, and Si, and Q is one or more of C, B, S, and O.

9. The coating according to claim 1, wherein said A and B layers have compositions according to the chemical formula $(Ti_{1-x2-y2}Si_{x2}Me_{y2})(N_{1-a2}Q_{a2})_{z2}$, where $0.02<x2<0.25$, $0<y2<0.3$, $0.90<z2<1.10$, $0\leq a2<0.5$, Me is one or more of Zr, Hf, V, Nb, Ta, Cr, Y, Sc, Ce, Mo, W, and Al, and Q is one or more of C, B, S, and O.

10. The coating according to claim 1, wherein said A and B layers have compositions according to the chemical formula $(Cr_{1-x3-y3}Al_{x3}Me_{y3})(N_{1-a3}Q_{a3})_{z3}$, where $0.3<x3<0.75$, $0\leq y3<0.3$, $0.90<z3<1.10$, $0\leq a3<0.5$, Me is one or more of Zr, Hf, V, Nb, Ta, Cr, Y, Sc, Ce, Mo, W, and Ti, and Q is one or more of C, B, S, and O.

11. The coating according to claim 1, wherein said A and B layers are deposited by cathodic arc evaporation.

12. A wear resistant PVD coating for chip forming metal machining cutting tools, comprising:
one or more D double layers, where each D double layer consists of one metal containing B layer and one metal containing A layer, the A layer being deposited onto the B layer without intermediate layers, and where A and B have essentially the same chemical composition but differ from each other with respect to their average grain widths, $w_A$ and $w_B$, so that $w_A<w_B$ and $w_B/w_A>2$ with $2<w_A<50$ nm and $30<w_B<500$ nm, and the metal layers contain Ti, Al or Si, Me, N and Q, where Me is one or more of Zr, Hf, V, Nb, Ta, Cr, Y, Sc, Ce, Mo, W, and Si or Al, and Q is one or more of C, B, S, and O,
wherein within each D double layer, the A layer is fine grained with $2<w_A<50$ nm, the B layer is coarse grained with $30<w_B<500$ nm, and
a thickness of each A layer is between 0.03 and 5 μm and a thickness of each B layer is between 0.1 and 5 μm, whereby the total thickness of all D double layers is between 0.3 and 20 μm.

13. The coating according to claim 12, wherein said A and B layers have compositions according to the chemical formula $(Ti_{1-x1-y1}Al_{x1}Me_{y1})(N_{1-a1}Q_{a1})_{z1}$, where $0.3<x1<0.7$, $0\leq y1<0.3$, $0.90<z1<1.10$, $0\leq a1<0.5$, Me is one or more of Zr, Hf, V, Nb, Ta, Cr, Y, Sc, Ce, Mo, W, and Si, and Q is one or more of C, B, S, and O.

14. The coating according to claim 12, wherein said A and B layers have compositions according to the chemical formula $(Ti_{1-x2-y2}Si_{x2}Me_{y2})(N_{1-a2}Q_{a2})_{z2}$, where $0.02<x2<0.25$, $0\leq y2<0.3$, $0.90<z2<1.10$, $0\leq a2<0.5$, Me is one or more of Zr, Hf, V, Nb, Ta, Cr, Y, Sc, Ce, Mo, W, and Al, and Q is one or more of C, B, S, and O.

* * * * *